(12) United States Patent
Kawashima et al.

(10) Patent No.: US 12,243,670 B2
(45) Date of Patent: Mar. 4, 2025

(54) COMMON MODE NOISE FILTER

(71) Applicant: Panasonic Intellectual Property Management Co., Ltd., Osaka (JP)

(72) Inventors: Takuji Kawashima, Fukui (JP); Masakatsu Nawate, Osaka (JP); Yu Onodera, Fukui (JP); Hideki Tanaka, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 682 days.

(21) Appl. No.: 17/266,693

(22) PCT Filed: Nov. 11, 2019

(86) PCT No.: PCT/JP2019/044177
§ 371 (c)(1),
(2) Date: Feb. 8, 2021

(87) PCT Pub. No.: WO2020/110692
PCT Pub. Date: Jun. 4, 2020

(65) Prior Publication Data
US 2021/0304942 A1      Sep. 30, 2021

(30) Foreign Application Priority Data
Nov. 30, 2018 (JP) ................................ 2018-224312

(51) Int. Cl.
*H01F 27/29*       (2006.01)
*H01F 17/00*       (2006.01)
(Continued)

(52) U.S. Cl.
CPC ......... *H01F 17/0013* (2013.01); *H01F 17/04* (2013.01); *H01F 27/2804* (2013.01);
(Continued)

(58) Field of Classification Search
CPC .. H01F 17/0013; H01F 17/04; H01F 27/2804; H01F 27/292; H01F 2017/0073;
(Continued)

(56) References Cited

U.S. PATENT DOCUMENTS

| 2006/0158301 A1* | 7/2006 | Shinkai | ............... H01F 17/0013 336/232 |
| 2010/0182724 A1* | 7/2010 | Ito | ........................ H03H 7/427 361/56 |

(Continued)

FOREIGN PATENT DOCUMENTS

| JP | 2001-060514 | 3/2001 |
| JP | 2010-080550 | 4/2010 |

(Continued)

OTHER PUBLICATIONS

International Search Report of PCT application No. PCT/JP2019/044177 dated Jan. 7, 2020.

*Primary Examiner* — Mang Tin Bik Lian
(74) *Attorney, Agent, or Firm* — Rimon P.C.

(57) ABSTRACT

An object of the present disclosure is to provide a common mode noise filter that can be used in a high-frequency band. The common mode noise filter of the present disclosure includes first to fifth insulator layers and stacked body in which first to fifth insulator layers are stacked along a vertical direction. The common mode noise filter further includes first spiral conductor and second spiral conductor that are formed inside stacked body and face each other across first insulator layer. The common mode noise filter further includes first pad connected to an inner end of first spiral conductor and second pad connected to an inner end of second spiral conductor. Neither first pad nor second pad overlaps each of first spiral conductor and second spiral conductor in top view.

20 Claims, 5 Drawing Sheets

(51) Int. Cl.
*H01F 17/04* (2006.01)
*H01F 27/28* (2006.01)
*H03H 7/09* (2006.01)
*H03H 7/42* (2006.01)

(52) U.S. Cl.
CPC ............ *H01F 27/292* (2013.01); *H03H 7/09* (2013.01); *H03H 7/427* (2013.01); *H01F 2017/0073* (2013.01); *H01F 2017/0093* (2013.01); *H01F 2027/2809* (2013.01)

(58) Field of Classification Search
CPC ..... H01F 2017/0093; H01F 2027/2809; H01F 17/0033; H01F 2017/0066; H01F 27/29; H03H 7/09; H03H 7/427; H03H 2001/0085
See application file for complete search history.

(56) References Cited

U.S. PATENT DOCUMENTS

| | | | |
|---|---|---|---|
| 2011/0002075 A1* | 1/2011 | Asakawa | H03H 7/0107 361/111 |
| 2011/0007438 A1* | 1/2011 | Ito | H03H 7/427 29/829 |
| 2011/0007439 A1* | 1/2011 | Asakawa | H03H 7/0107 361/111 |
| 2014/0191824 A1* | 7/2014 | Yoshino | H03H 7/427 333/185 |
| 2015/0091685 A1* | 4/2015 | Kitajima | H01F 17/0013 29/602.1 |
| 2016/0372254 A1* | 12/2016 | Harada | H01F 27/2804 |
| 2018/0122563 A1* | 5/2018 | Matsuura | H01F 17/0013 |
| 2018/0286558 A1* | 10/2018 | Yokoyama | H01F 27/2804 |
| 2018/0367115 A1 | 12/2018 | Oomori et al. | |
| 2019/0080839 A1* | 3/2019 | Annen | H01F 27/24 |
| 2020/0066432 A1* | 2/2020 | Ishikawa | H01F 17/06 |

FOREIGN PATENT DOCUMENTS

| | | | |
|---|---|---|---|
| JP | 2015035464 | * | 2/2015 |
| WO | 2017/221794 | | 12/2017 |

* cited by examiner

COMMON MODE NOISE FILTER

CROSS-REFERENCE TO RELATED APPLICATIONS

This application is a U.S. national stage application of the PCT International Application No. PCT/JP2019/044177 filed on Nov. 11, 2019, which claims the benefit of foreign priority of Japanese patent application No. 2018-224312 filed on Nov. 30, 2018, the contents all of which are incorporated herein by reference.

FIELD OF THE INVENTION

The present disclosure relates to a common mode noise filter used for various electronic devices such as digital devices, audio visual (AV) devices, and information communication terminals.

DESCRIPTION OF THE RELATED ART

Figure 6:
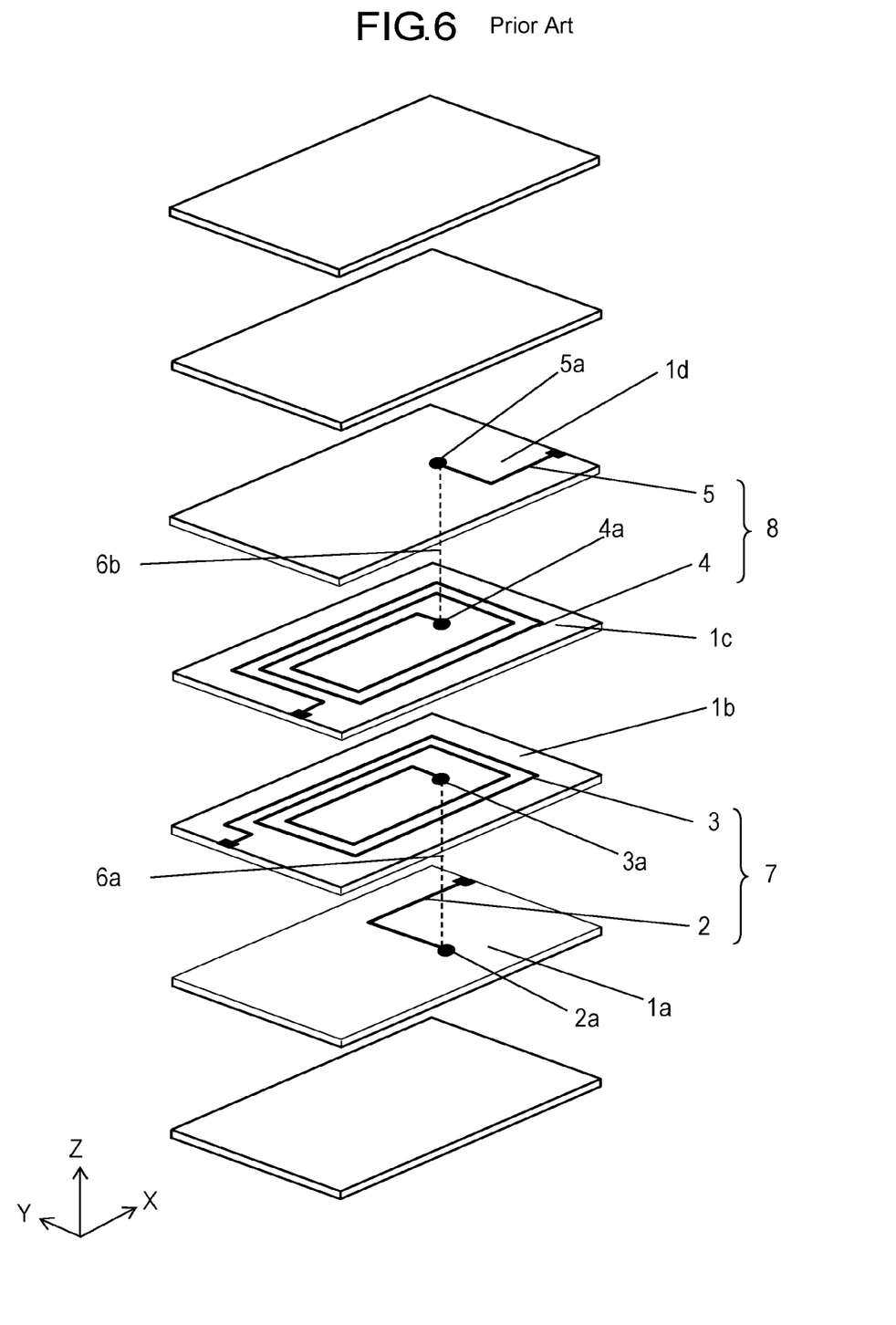
FIG. 6 is an exploded perspective view of a conventional common mode noise filter.

As illustrated in FIG. 6, a conventional common mode noise filter of this type includes conductors 2 to 5 disposed on upper surfaces of insulating layers 1a to 1d, respectively. Pad 2a formed at one end of conductor 2 and pad 3a formed at one end of conductor 3 are connected through via electrode 6a to form coil 7. At the same time, pad 4a formed at one end of conductor 4 and pad 5a formed at one end of conductor 5 are connected through via electrode 6b to form coil 8. In addition, conductor 3 and conductor 4 are spirally wound, and the other end of each of conductors 2 to 5 is connected to an external electrode (not illustrated; the same applies to the following).

Examples of known technical documents related to the present disclosure include PTL 1.

CITATION LIST

Patent Literature

PTL 1: Unexamined Japanese Patent Publication No. 2001-60514

SUMMARY OF THE INVENTION

In the above-described conventional common mode noise filter, pads 2a to 5a overlap one another in top view and are further connected to via electrode 6a and via electrode 6b. Therefore, the width or diameter of each of pad 3a and pad 4a is greater than the line width of each of coil 7 and coil 8 that transmit differential signals and are magnetically coupled. As a result, a significant stray capacitance is generated among pads 2a to 5a, which causes inconsistent differential signals in a high-frequency to increase insertion loss, posing a problem of difficulty in using the common mode noise filter in a high-frequency band.

An object of the present disclosure is to solve the above-described conventional problems by providing a common mode noise filter that can be used in a high-frequency band.

A common mode noise filter of the present disclosure includes a first insulator layer, a first conductor, and a second conductor. The first insulator layer includes a main surface and a back surface. The first conductor is disposed on the back surface of the first insulator layer. The second conductor is disposed on the main surface of the first insulator layer. The first conductor includes a first spiral body, a first pad, and a first connecting portion. The first spiral body is disposed at a position where at least part of the first spiral body overlaps the second conductor as viewed from a direction that the main surface of the first insulator layer faces. The first spiral body is in a spiral shape. The first pad is disposed inside the first spiral body on the back surface of the first insulator layer. The first connecting portion includes a pair of side edges. The first connecting portion connects the first spiral body and the first pad on the back surface of the first insulator layer. The second conductor includes a second spiral body, a second pad, and a second connecting portion. The second spiral body is disposed at a position where at least part of the second spiral body overlaps the first conductor as viewed from the direction that the main surface of the first insulator layer faces. The second spiral body is in a spiral shape. The second pad is disposed inside the second spiral body on the main surface of the first insulator layer. The second connecting portion includes a pair of side edges. The second connecting portion connects the second spiral body and the second pad on the main surface of the first insulator layer. The first pad is disposed at a position where the first pad does not overlap the second spiral conductor as viewed from the direction that the main surface of the first insulator layer faces.

In the common mode noise filter of the present disclosure, the first pad, the second pad, the first spiral conductor, and the second spiral conductor are disposed so that neither the first pad nor the second pad overlaps each of the first spiral conductor and the second spiral conductor in top view, and therefore, the stray capacitance between each of the first and second pads and each of the first and second spiral conductors can be reduced. This can prevent inconsistent differential signals from being generated in a high-frequency band to suppress an increase in insertion loss, providing the effect of enabling the use of the common mode noise filter in a high-frequency band.

DETAILED DESCRIPTION OF THE PREFERRED EMBODIMENTS

A common mode noise filter according to aspects of the present disclosure will now be described.

A common mode noise filter according to a first aspect includes a first insulator layer, a first conductor, and a second conductor. The first insulator layer includes a main surface and a back surface. The first conductor is disposed on the back surface of the first insulator layer. The second conductor is disposed on the main surface of the first insulator layer. The first conductor includes a first spiral body, a first pad, and a first connecting portion. The first spiral body is disposed at a position where at least part of the first spiral body overlaps the second conductor as viewed from a direction that the main surface of the first insulator layer faces. The first spiral body is in a spiral shape. The first pad is disposed inside the first spiral body on the back surface of the first insulator layer. The first connecting portion connects the first spiral body and the first pad on the back surface of the first insulator layer. The second conductor includes a second spiral body, a second pad, and a second connecting portion. The second spiral body is disposed at a position where at least part of the second spiral body overlaps the first conductor as viewed from the direction that the main surface of the first insulator layer faces. The second spiral body is in a spiral shape. The second pad is disposed inside the second spiral body on the main surface of the first insulator layer. The second connecting portion includes a pair of side edges. The second connecting portion connects the second spiral body and the second pad on the main surface of the first insulator layer. The first pad is disposed at a position where the first pad does not overlap the second spiral conductor as viewed from the direction that the main surface of the first insulator layer faces.

In the common mode noise filter according to a second aspect, the second pad is disposed at a position where the second pad does not overlap the first spiral conductor as viewed from the direction that the main surface of the first insulator layer faces in the first aspect.

In the common mode noise filter according to a third aspect, the first connecting portion includes a pair of side edges in the first or second aspect. Furthermore, the second pad includes a portion that does not overlap the first spiral conductor and a portion that overlaps the first connecting portion as viewed from the direction that the main surface of the first insulator layer faces. Moreover, the portion where the second pad overlaps the first connecting portion overlaps one of the pair of side edges of the first connecting portion and does not overlap the other one of the pair of side edges, as viewed from the direction that the main surface of the first insulator layer faces.

In the common mode noise filter according to a fourth aspect, the second connecting portion includes a pair of side edges in any one of the first to third aspects. Furthermore, the first pad includes a portion that does not overlap the second spiral conductor and a portion that overlaps the second connecting portion as viewed from the direction that the main surface of the first insulator layer faces. Moreover, the portion where the first pad overlaps the second connecting portion overlaps one of the pair of side edges of the second connecting portion and does not overlap the other one of the pair of side edges, as viewed from the direction that the main surface of the first insulator layer faces.

The common mode noise filter according to a fifth aspect includes a second insulator layer, a third insulator layer, a first lead-out conductor, and a second lead-out conductor in any one of the first to fourth aspects. The second insulator layer covers the first spiral body on the back surface of the first insulator layer. The third insulator layer covers the second spiral body on the main surface of the first insulator layer. The first lead-out conductor is disposed on the back surface of the second insulator layer. One end of the first lead-out conductor is connected to the first pad. The second lead-out conductor is disposed on the main surface of the third insulator layer. One end of the second lead-out conductor is connected to the second pad. The first lead-out conductor does not overlap the second lead-out conductor as viewed from the main surface of the first insulator layer.

The common mode noise filter according to a sixth aspect includes a magnetic core that passes through the first insulator layer in any one of the first to fifth aspects. The magnetic core is disposed inside the first spiral body as viewed from the direction that the main surface of the first insulator layer faces, the magnetic core being on neither the first pad nor the second pad.

The common mode noise filter according to a seventh aspect has the following characteristics in any one of the first to sixth aspects. Specifically, first line segment length w1 is defined as the length of the shortest line segment that crosses the first pad and the second pad and connects two points on the inner peripheral side of the spiral shape of the first spiral conductor, as viewed from the direction that the main surface of the first insulator layer faces. Second line segment length w2 is defined as the length of the shortest line segment that is parallel to the first line segment, crosses the magnetic core, and connects two points on the inner peripheral side of the spiral shape of the first spiral conductor. In this case, w1<w2.

In the common mode noise filter according to an eighth aspect, the first spiral conductor includes the first spiral body that has a linear portion and a curved portion in any one of the first to seventh aspects. Furthermore, the second spiral conductor includes the second spiral body that has a linear portion and a curved portion.

In the common mode noise filter according to a ninth aspect, the first lead-out conductor includes a portion that overlaps the linear portion of the first spiral conductor in the eighth aspect, as viewed from the direction that the main surface of the first insulator layer faces. The second lead-out conductor includes a portion that overlaps the linear portion of the second spiral conductor as viewed from the direction that the main surface of the first insulator layer faces.

The common mode noise filter according to a tenth aspect includes a third lead-out conductor that is connected to an outer side of the first spiral body in any one of the first to ninth aspects. The common mode noise filter further includes a fourth lead-out conductor that is connected to an outer side of the second spiral body. The common mode noise filter includes a first lead-out portion that connects the outer side of the first spiral body and the third lead-out conductor. The common mode noise filter further includes a second lead-out portion that connects the outer side of the second spiral body and the fourth lead-out conductor. The first lead-out portion does not overlap the second lead-out portion as viewed from the direction that the main surface of the first insulator layer faces.

In the common mode noise filter according to an eleventh aspect, the first pad and the second pad do not overlap each other as viewed from the direction that the main surface of the first insulator layer faces in any one of the first to tenth aspects.

The following describes one exemplary embodiment of the present disclosure. Note that the size of the common mode noise filter according to the present disclosure and the material and size of each of the layers included in the filter are merely examples, and that the technical scope of the common mode noise filter according to the present disclosure is not limited to any value or material disclosed herein.

One Exemplary Embodiment

Figure 1:
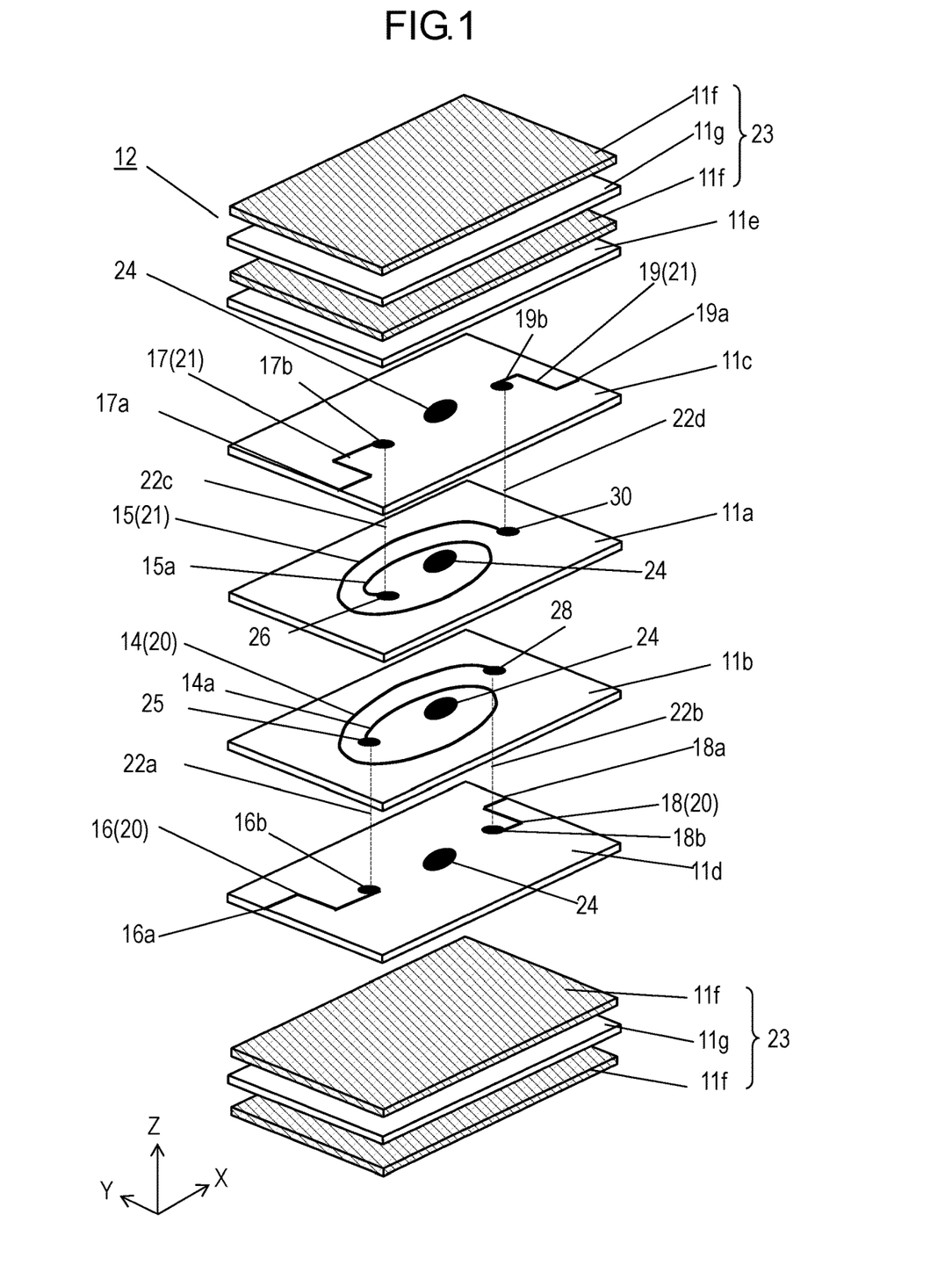
FIG. 1 is an exploded perspective view schematically showing a common mode noise filter according to one exemplary embodiment of the present disclosure.
Figure 2:
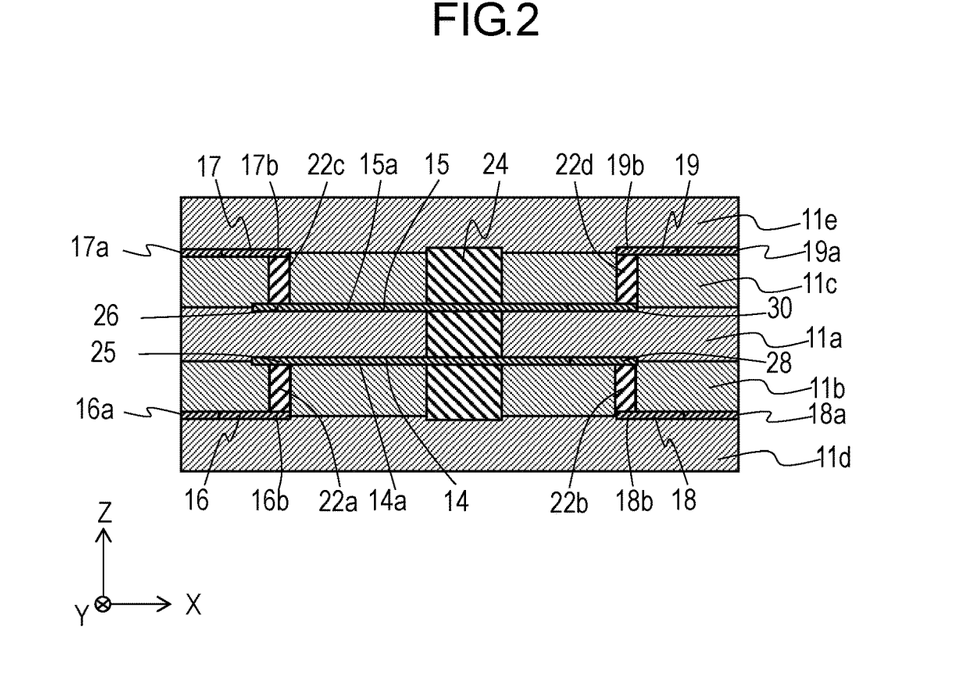
FIG. 2 is a cross-sectional view schematically showing the common mode noise filter.
Figure 3:
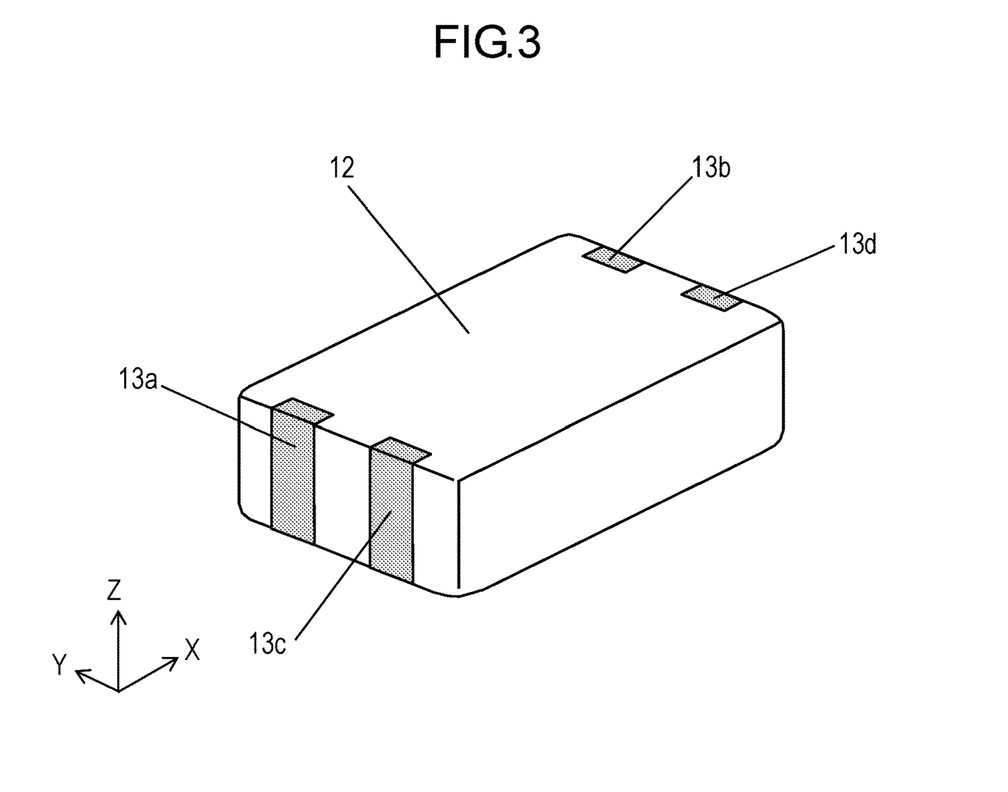
FIG. 3 is a perspective view of the common mode noise filter.

FIG. 1 is an exploded perspective view of a common mode noise filter according to one exemplary embodiment of the present disclosure. FIG. 2 is a cross-sectional view of the common mode noise filter according to one exemplary embodiment of the present disclosure. FIG. 3 is a perspective view of the common mode noise filter according to one exemplary embodiment of the present disclosure.

As illustrated in FIG. 3, the common mode noise filter according to one exemplary embodiment of the present disclosure includes stacked body 12 and first to fourth external electrodes 13a to 13d disposed outside stacked body 12. As illustrated in FIGS. 1 and 2, stacked body 12 includes first to fifth insulator layers 11a to 11e stacked along a vertical direction. Stacked body 12 further includes first spiral conductor 14, second spiral conductor 15, first to fourth lead-out conductors 16 to 19, first coil 20, and second coil 21, all of which are formed inside. First lead-out conductor 16, first spiral conductor 14, and third lead-out conductor 18 are connected to provide first coil 20. Second lead-out conductor 17, second spiral conductor 15, and fourth lead-out conductor 19 are connected to provide second coil 21.

Note that, in FIG. 1, the direction along the longer side of stacked body 12 is denoted as X axis, the direction along the shorter side thereof is denoted as Y axis, and the direction along which first to fifth insulator layers 11a to 11e are stacked is denoted as Z axis.

Here, dimensions of the common mode noise filter are 2 mm long (X direction), 1.5 mm wide (Y direction), and 1.5 mm high (Z direction). Note that each of first to fifth insulator layers 11a to 11e has a layer thickness of 60 µm.

First spiral conductor 14 and second spiral conductor 15 face each other across first insulator layer 11a. First insulator layer 11a has a main surface (upper surface) and a back surface (lower surface) on the side opposite to the main surface. Second spiral conductor 15 is disposed on the main surface of first insulator layer 11a. First spiral conductor 14 is disposed on the back surface of first insulator layer 11a. One end 16a of first lead-out conductor 16 is connected to first external electrode 13a. One end 17a of second lead-out conductor 17 is connected to third external electrode 13c. One end 18a of third lead-out conductor 18 is connected to second external electrode 13b. One end 19a of fourth lead-out conductor 19 is connected to fourth external electrode 13d.

In the above configuration, fourth insulator layer 11d is made of a magnetic material such as Cu—Ni—Zn ferrite or a non-magnetic material such as Cu—Zn ferrite or glass ceramics to be formed into a sheet and has insulating properties.

In addition, first lead-out conductor 16 and third lead-out conductor 18 are each formed by plating or printing a conductive material such as silver on the upper surface of fourth insulator layer 11d. Note that first lead-out conductor 16 and third lead-out conductor 18 are led out from fourth insulator layer 11d in opposite directions. One end 16a of first lead-out conductor 16 is connected to first external electrode 13a, while one end 18a of third lead-out conductor 18 is connected to second external electrode 13b.

Second insulator layer 11b is made of a non-magnetic material such as Cu—Zn ferrite or glass ceramics to be formed into a sheet, has insulating properties, and is disposed on the upper surfaces of first lead-out conductor 16 and third lead-out conductor 18. In addition, second insulator layer 11b includes first via electrode 22a and second via electrode 22b.

Here, first lead-out conductor 16 and first via electrode 22a are connected. Likewise, third lead-out conductor 18 and second via electrode 22b are connected.

Furthermore, first spiral conductor 14 is formed by plating or printing a conductive material such as silver in a spiral manner. First spiral conductor 14 is disposed on the upper surface of second insulator layer 11b. Furthermore, one end (inner end) of first spiral conductor 14, that is, a portion in the center of the spiral, is connected to first via electrode 22a. Accordingly, first spiral conductor 14 is electrically connected to first lead-out conductor 16 via first via electrode 22a.

The other end (outer end) of first spiral conductor 14 is connected to second via electrode 22b. Accordingly, first spiral conductor 14 is electrically connected to third lead-out conductor 18 via second via electrode 22b.

This configuration results in forming first coil 20 that includes first spiral conductor 14 and first and third lead-out conductors 16 and 18 connected thereto.

Furthermore, on fourth insulator layer 11d, there are first lead-out conductor 16 and third lead-out conductor 18, both of which are connected to first spiral conductor 14. Accordingly, first spiral conductor 14 is electrically connected to first external electrode 13a via first lead-out conductor 16. Likewise, first spiral conductor 14 is electrically connected to second external electrode 13b via third lead-out conductor 18.

Note that third lead-out conductor 18 may be formed on second insulator layer 11b. In this case, second via electrode 22b is unnecessary.

First insulator layer 11a is made of a non-magnetic material such as Cu—Zn ferrite or glass ceramics to be formed into a sheet, has insulating properties, and is disposed on the upper surface of first spiral conductor 14.

In addition, second spiral conductor 15 is formed by plating or printing a conductive material such as silver in a spiral manner, and is disposed on the upper surface of first insulator layer 11a. Furthermore, second spiral conductor 15 and first spiral conductor 14 face each other across first insulator layer 11a so as overlap each other as viewed from above the upper surface of first insulator layer 11a (from the direction that the main surface faces as viewed from first insulator layer 11a, that is, from the positive direction of the Z axis), so that first and second spiral conductors 14 and 15 are magnetically coupled. Viewing from above the upper surface of first insulator layer 11a is hereinafter referred to as "top view".

Third insulator layer 11c is made of a non-magnetic material such as Cu—Zn ferrite or glass ceramics to be formed into a sheet, has insulating properties, and is disposed on the upper surface of second spiral conductor 15.

In third insulator layer 11c, third via electrode 22c and fourth via electrode 22d are formed. One end (inner end) of second spiral conductor 15, that is, a portion in the center of the spiral, is connected to third via electrode 22c. The other end (outer end) of second spiral conductor 15 is connected to fourth via electrode 22d.

Second lead-out conductor 17 and fourth lead-out conductor 19 are each formed by plating or printing a conductive material such as silver on the upper surface of third insulator layer 11c. Note that second lead-out conductor 17 and fourth lead-out conductor 19 are led out from third insulator layer 11c in opposite directions.

Second lead-out conductor 17 is connected to third via electrode 22c. Accordingly, second lead-out conductor 17 is electrically connected to the inner end of second spiral conductor 15 via third via electrode 22c. Fourth lead-out conductor 19 is connected to fourth via electrode 22d. Accordingly, fourth lead-out conductor 19 is electrically connected to the outer end of second spiral conductor 15 via fourth via electrode 22d.

This configuration results in forming second coil 21 that includes second spiral conductor 15, second lead-out conductor 17, and fourth lead-out conductor 19.

Furthermore, on third insulator layer 11c, second lead-out conductor 17 and fourth lead-out conductor 19, both of which are connected to second spiral conductor 15, are formed. Second spiral conductor 15 is connected to third external electrode 13c via second lead-out conductor 17. In addition, second spiral conductor 15 is connected to fourth external electrode 13d via fourth lead-out conductor 19.

Note that fourth lead-out conductor 19 connected to the outer end of second spiral conductor 15 may be formed on first insulator layer 11a. In this case, fourth via electrode 22d is unnecessary.

First via electrode 22a and second via electrode 22b are each formed by filling a hole that is created through second insulator layer 11b with a conductive material such as silver. Third via electrode 22c and fourth via electrode 22d are each formed by filling a hole that is created through third insulator layer 11c with a conductive material such as silver.

Fifth insulator layer 11e is made of a magnetic material such as Cu—Ni—Zn ferrite or a non-magnetic material such as Cu—Zn ferrite or glass ceramics to be formed into a sheet, has insulating properties, and is disposed on the upper surfaces of second lead-out conductor 17 and fourth lead-out conductor 19.

Furthermore, on the lower surface of fourth insulator layer 11d and on the upper surface of fifth insulator layer 11e, there is disposed dummy portion 23 in which magnetic material layers 11f and non-magnetic material layers 11g are stacked alternately. Magnetic material layers 11f and non-magnetic material layers 11g are each formed into a sheet and have insulating properties. Note that dummy portion 23 may include magnetic material layer 11f only or non-magnetic material layer 11g only.

In addition, the number of layers constituting first to fifth insulator layers 11a to 11e and dummy portion 23 is not limited to the number shown in FIG. 1.

As described above, stacked body 12 is formed by stacking first to fifth insulator layers 11a to 11e and dummy portions 23. Furthermore, first to fourth external electrodes 13a to 13d are disposed on both end faces of stacked body 12. First external electrode 13a is electrically connected to one end 16a of first lead-out conductor 16. Second external electrode 13b is electrically connected to one end 17a of second lead-out conductor 17. Third external electrode 13c is electrically connected to one end 18a of third lead-out conductor 18. Fourth external electrode 13d is electrically connected to one end 19a of fourth lead-out conductor 19.

Note that, through first to fifth insulator layers 11a to 11e, a through hole is provided in a portion corresponding to the inside of first spiral conductor 14 and second spiral conductor 15 in top view. The through hole is filled with a magnetic material to provide magnetic core 24 so as to increase the common mode impedance of the common mode noise filter.

Figure 4:
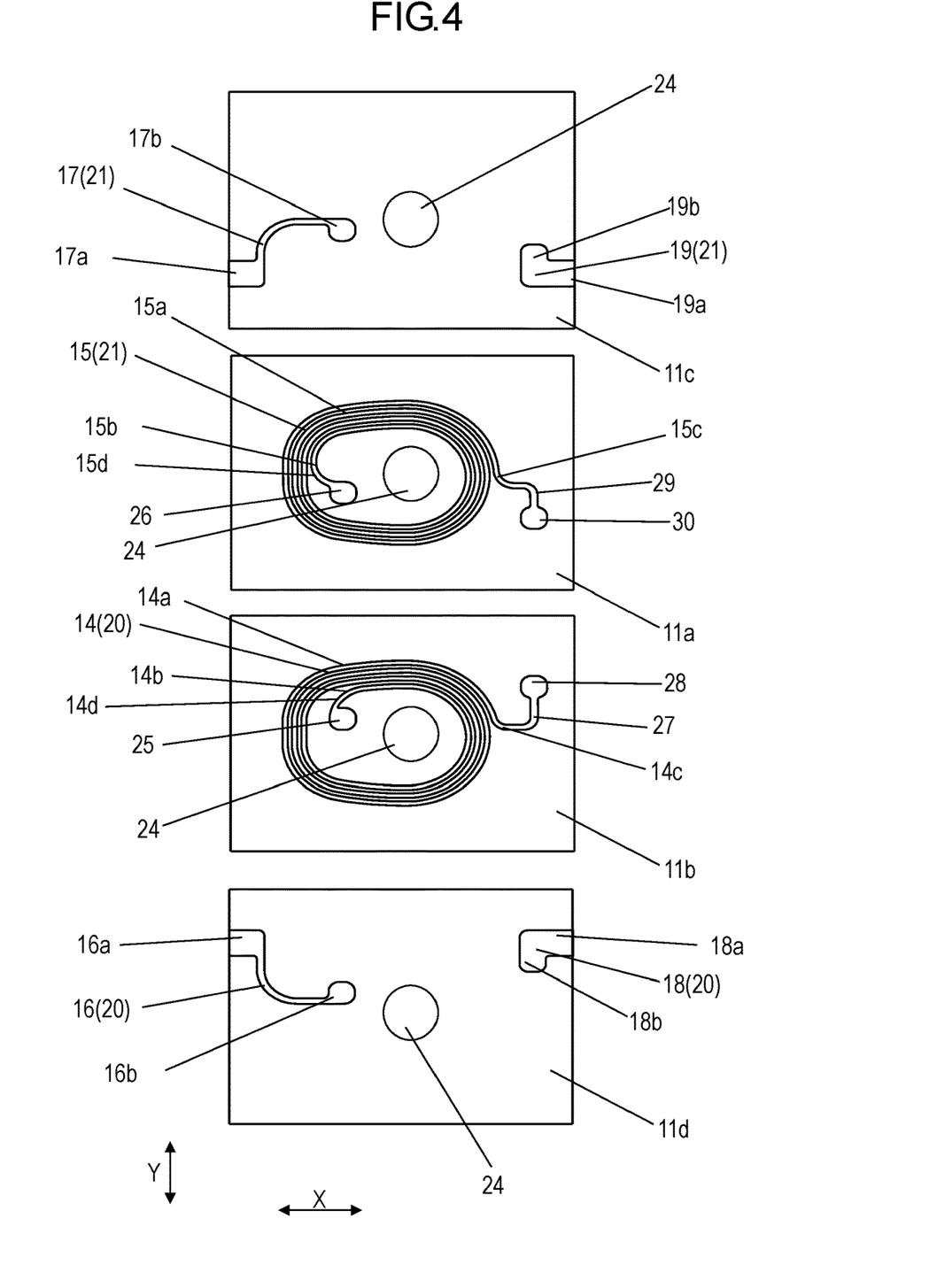
FIG. 4 shows top views of major parts of the common mode noise filter.

FIG. 4 is a schematic diagram mainly showing a positional relationship among components. Referring to FIG. 4, the following describes first spiral conductor 14, second spiral conductor 15, and first to fourth lead-out conductors 16 to 19 in detail.

FIG. 4 shows, from top to bottom, top views of second lead-out conductor 17 and fourth lead-out conductor 19 present in third insulator layer 11c, second spiral conductor 15 present in first insulator layer 11a, first spiral conductor 14 present in second insulator layer 11b, and first lead-out conductor 16 and third lead-out conductor 18 present in fourth insulator layer 11d.

On the upper surface of third insulator layer 11c, there are disposed second lead-out conductor 17, fourth lead-out conductor 19, one end 17a connected to third external electrode 13c, one end 19a connected to fourth external electrode 13d, third via electrode 22c, another end 17b connected to third via electrode 22c, fourth via electrode 22d, and another end 19b connected to fourth via electrode 22d. One end 17a and another end 17b of second lead-out conductor 17 each have a larger line width than remaining portions.

On the upper surface of first insulator layer 11a, second spiral conductor 15 is formed. Second spiral conductor 15 includes second spiral body 15a, which is in a spiral shape, and inner end 15b and outer end 15c thereof.

Inner end 15b is connected to another end 17b of second lead-out conductor 17 via third via electrode 22c. Outer end 15c is connected to another end 19b of fourth lead-out conductor 19 via fourth via electrode 22d.

On the upper surface of second insulator layer 11b, first spiral conductor 14 is formed. First spiral conductor 14 includes first spiral body 14a, which is in a spiral shape, and inner end 14b and outer end 14c thereof.

Inner end 14b is connected to first via electrode 22a, while outer end 14c is connected to second via electrode 22b.

On the upper surface of fourth insulator layer 11d, there are disposed first lead-out conductor 16, one end 16a connected to first external electrode 13a, third lead-out conductor 18, one end 18a connected to second external electrode 13b, another end 16b connected to first via electrode 22a, and another end 18b connected to second via electrode 22b. One end 16a and another end 16b of first lead-out conductor 16 each have a larger line width than remaining portions.

Inner end 14b of first spiral body 14a is connected to another end 16b of first lead-out conductor 16 via first via electrode 22a. Outer end 14c is connected to another end 18b of third lead-out conductor 18 via second via electrode 22b.

First spiral body 14a of first spiral conductor 14 and second spiral body 15a of second spiral conductor 15 include curved portions being curved in top view and linear portions. Because of the curved portions, the coil length of each of the spiral bodies can be made shorter. As a result, the direct current resistance value can be reduced. Note that the curved portions have a relatively large curvature radius of 150 μm to 250 μm.

A linear portion of first spiral conductor 14 overlaps first lead-out conductor 16 in top view. A linear portion of second spiral conductor 15 overlaps second lead-out conductor 17 in top view. Curved portions of first spiral conductor 14 are present near inner end 14b of first spiral body 14a and near magnetic core 24. Curved portions of second spiral conductor 15 are present near inner end 15b of second spiral body 15a and near magnetic core 24. Both the portion near inner end 14b of first spiral conductor 14 and the portion near inner end 15b of second spiral conductor 15 are smaller in curvature radius than the portion near magnetic core 24.

Here, inner end 14b of first spiral body 14a is connected to first pad 25 via first connecting portion 14d. Inner end 15b of second spiral body 15a is connected to second pad 26 via second connecting portion 15d. Outer end 14c of first spiral body 14a is connected to third pad 28 via first lead-out portion 27. Outer end 15c of second spiral body 15a is connected to fourth pad 30 via second lead-out portion 29.

Therefore, first pad 25, third pad 28, first connecting portion 14d, and first lead-out portion 27 form part of first coil 20. Second pad 26, fourth pad 30, second connecting portion 15d, and second lead-out portion 29 form part of second coil 21. First pad 25, second pad 26, third pad 28, and fourth pad 30 each have a line width of 90 μm, which is wider than the line width (10 μm) of first spiral conductor 14 and the line width (10 μmm) of second spiral conductor 15.

Magnetic core 24 is disposed inside first spiral conductor 14 and second spiral conductor 15 in top view. In top view, magnetic core 24 is located between either of inner end 14b of first spiral body 14a and inner end 15b of second spiral body 15a and the innermost periphery of either of first spiral conductor 14 and second spiral conductor 15, and is located so that magnetic core 24, inner end 14b of first spiral body 14a, and inner end 15b of second spiral body 15a are aligned along first direction X.

Figure 5:
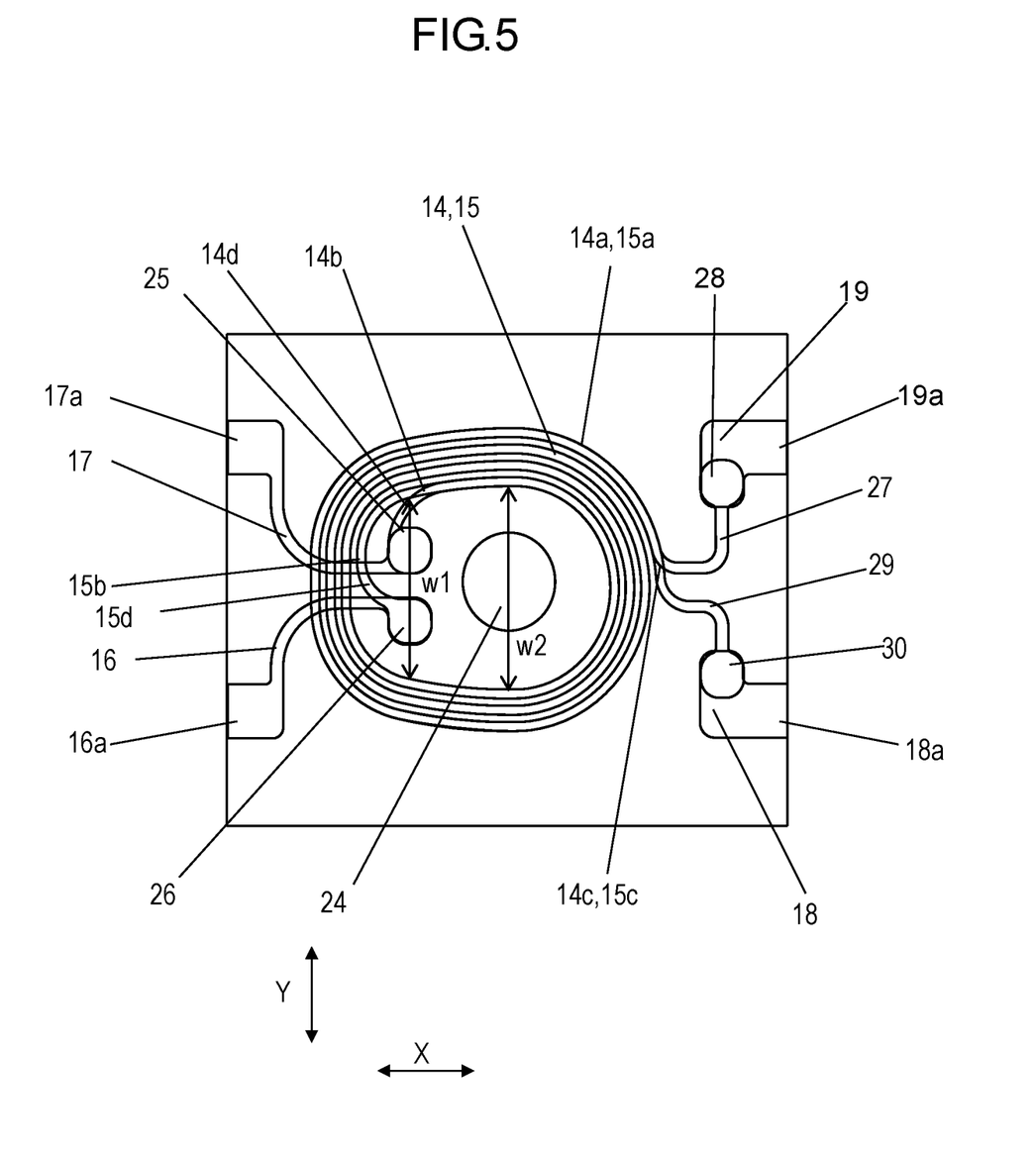
FIG. 5 is a top view of major parts of the common mode noise filter.

FIG. 5 is a diagram of first spiral conductor 14, second spiral conductor 15, and first to fourth lead-out conductors 16 to 19, as viewed from above.

As can be seen from FIG. 5, each of first pad 25 and second pad 26 is disposed so as not to overlap first spiral conductor 14 or second spiral conductor 15 in top view.

That is, first pad 25 does not overlap any portion of second spiral conductor 15, and second pad 26 does not overlap any portion of first spiral conductor 14. Note that first pad 25 does not overlap first spiral conductor 14, and second pad 26 does not overlap second spiral conductor 15.

In addition, first pad 25 may include, in top view, a portion that does not overlap second spiral conductor 15 and a portion that overlaps second connecting portion 15d. In this case, in top view, the portion where first pad 25 overlaps second connecting portion 15d overlaps one of a pair of side edges of second connecting portion 15d and does not overlap the other one. The pair of side edges of second connecting portion 15d refers to the line portions facing each other in the line width direction of second connecting portion 15d.

Likewise, second pad 26 may include, in top view, a portion that does not overlap first spiral conductor 14 and a portion that overlaps first connecting portion 14d. In this case, in top view, the portion where second pad 26 overlaps first connecting portion 14d overlaps one of a pair of side edges of first connecting portion 14d and does not overlap the other one.

Although first pad 25 and second pad 26 may overlap each other in top view, it is preferable that first pad 25 and second pad 26 do not overlap each other in top view as illustrated in FIG. 5. As a result, the stray capacitance between first pad 25 and second pad 26 can be reduced.

In addition, third pad 28 and fourth pad 30 are disposed so as not to overlap each other in top view, whereby the stray capacitance between third pad 28 and fourth pad 30 is reduced.

In top view, the distance between third pad 28 and fourth pad 30 is larger than the distance between first pad 25 and second pad 26. As a result, the stray capacitance between third pad 28 and fourth pad 30 can be reduced. Note that the distance between first pad 25 and second pad 26 can be increased only to a limited extent because first pad 25 and second pad 26 are located inside first spiral conductor 14 and second spiral conductor 15.

Furthermore, first lead-out conductor 16 and second lead-out conductor 17 do not overlap each other in top view, and first lead-out portion 27 and second lead-out portion 29 do not overlap with each other in top view. Moreover, third lead-out conductor 18 and fourth lead-out conductor 19 do not overlap each other in top view. As a result, the stray capacitance between first lead-out conductor 16 and second lead-out conductor 17 and the stray capacitance between first lead-out portion 27 and second lead-out portion 29 can be reduced.

In addition, a linear portion of first spiral body 14a and a linear portion of second spiral body 15a overlap first lead-out conductor 16 and second lead-out conductor 17 in top view. Curved portions of first spiral body 14a and curved portions of second spiral body 15a overlap neither first lead-out conductor 16 nor second lead-out conductor 17 in top view. Curved portions can be protected from a load that may be applied by a stress caused during stacking.

Here, first line segment length w1 is defined as, in top view, the length of the shortest line segment that crosses the centers of first pad 25 and second pad 26 along direction Y orthogonal to first direction X and connects two points on the innermost periphery of the spiral shape of first spiral conductor 14. In addition, second line segment length w2 is defined as the length of the shortest line segment that is parallel to the first line segment, crosses the center of magnetic core 24, and connects two points on the innermost peripheral of the spiral shape of first spiral conductor 14. In this case, w1 is shorter than w2. That is, w1<w2.

Note that inner end 14b of first spiral body 14a and inner end 15b of second spiral body 15a are aligned along Y direction.

This configuration provides a larger area in which magnetic core 24 can be formed. As the area of magnetic core 24 is larger in top view, the magnetic flux in magnetic core 24 can be increased, and thus the common mode impedance can be further increased.

Note that magnetic core 24 is on neither first pad 25 nor second pad 26.

FIG. 5 shows that second connecting portion 15d of second spiral conductor 15 directed to second pad 26 passes outside first pad 25; however, second connecting portion 15d may pass between first pad 25 and magnetic core 24 (on the inner side of first pad 25).

As described above, in the common mode noise filter according to one exemplary embodiment of the present disclosure, first pad 25, second pad 26, first spiral conductor 14, and second spiral conductor 15 are disposed so that neither first pad 25 nor second pad 26 overlaps each of first spiral conductor 14 and second spiral conductor 15 in top view. Therefore, the stray capacitance between each of first pad 25 and second pad 26 and each of first spiral conductor 14 and second spiral conductor 15 can be reduced. This can prevent inconsistent differential signals from being generated in a high-frequency band to suppress an increase in insertion loss, providing an effect of enabling the use of the common mode noise filter in a high-frequency band.

The common mode noise filter according to the present disclosure provides an effect of enabling the use of the common mode noise filter in a high-frequency band, and is particularly useful for, for example, small and thin common mode noise filters used in digital devices, AV devices, information communication terminals, and the like.

The invention claimed is:

1. A common mode noise filter comprising:
a first insulator layer that includes a main surface and a back surface and has a rectangular shape as viewed in a normal direction perpendicular to the main surface;
a first conductor that is disposed on the back surface of the first insulator layer;
a second conductor that is disposed on the main surface of the first insulator layer; and
a magnetic core that passes through the first insulator layer, wherein:
the first conductor includes:
a first spiral body that is disposed at a position where at least part of the first spiral body overlaps the second conductor as viewed in the normal direction, the first spiral body beings wound around the magnetic core;
a first pad that is disposed inside the first spiral body on the back surface as viewed in the normal direction; and
a first connecting portion that connects the first spiral body and the first pad on the back surface,
the second conductor includes:
a second spiral body that is disposed at a position where at least part of the second spiral body overlaps the first conductor as viewed in the normal direction, the second spiral body being wound around the magnetic core;
a second pad that is disposed inside the second spiral body on the main surface as viewed in the normal direction; and
a second connecting portion that connects the second spiral body and the second pad on the main surface,
the first pad is disposed at a position where the first pad does not overlap the second conductor as viewed in the normal direction,
the second connecting portion is disposed at an outer side of the first pad opposite to an inner side of the first pad facing the magnetic core,
a line passing through the first pad and the second pad is parallel to one side of the rectangular shape of the first insulator layer, and
both the first pad and the second pad are disposed between the one side and the magnetic core.

2. The common mode noise filter according to claim 1, wherein the second pad is disposed at a position where the second pad does not overlap the first conductor as viewed in the normal direction.

3. The common mode noise filter according to claim 1, further comprising:
a second insulator layer that covers the first spiral body on the back surface of the first insulator layer and disposed between the first stack and the first insulator layer;
a third insulator layer that covers the second spiral body on the main surface of the first insulator layer and disposed between the second stack and the first insulator layer;
a first lead-out conductor that is disposed on the back surface of the second insulator layer and includes one end connected to the first pad; and
a second lead-out conductor that is disposed on the main surface of the third insulator layer and includes one end connected to the second pad, wherein
the first lead-out conductor does not overlap the second lead-out conductor as viewed in the normal direction.

4. The common mode noise filter according to claim 3, wherein
the first spiral body has a linear portion and a curved portion, and
the second spiral body has a linear portion and a curved portion.

5. The common mode noise filter according to claim 4, wherein
the first lead-out conductor includes a portion that overlaps the linear portion of the first spiral body as viewed in the normal direction, and
the second lead-out conductor includes a portion that overlaps the linear portion of the second spiral body as viewed in the normal direction.

6. The common mode noise filter according to claim 3, further comprising:
a third lead-out conductor that is connected to an outer side of the first spiral body;
a fourth lead-out conductor that is connected to an outer side of the second spiral body;
a first lead-out portion that connects the outer side of the first spiral body and the third lead-out conductor; and
a second lead-out portion that connects the outer side of the second spiral body and the fourth lead-out conductor, wherein
the first lead-out portion does not overlap the second lead-out portion as viewed in the normal direction.

7. The common mode noise filter according to claim 3, wherein the second connecting portion overlaps the second lead-out conductor as viewed in the normal direction.

8. The common mode noise filter according to claim 1, wherein the magnetic core is on neither the first pad nor the second pad.

9. The common mode noise filter according to claim 8, wherein length of a first line segment, which is a shortest line segment that crosses the first pad and the second pad and connects two points on an inner peripheral side of the first spiral body of the first conductor as viewed in the normal direction, is shorter than length of a second line segment, which is a shortest line segment that is parallel to the first line segment, crosses the magnetic core, and connects two points on the inner peripheral side of the second spiral body of the first conductor.

10. The common mode noise filter according to claim 1, wherein the first pad and the second pad do not overlap each other as viewed in the normal direction.

11. The common mode noise filter according to claim 1, wherein
the common mode noise filter further comprises a first stack disposed over the first conductor and a second stack disposed over the second conductor, and
each of the first and second stacks includes two magnetic material layers and a non-magnetic material layer disposed between the two magnetic material layers.

12. The common mode noise filter according to claim 1, wherein
neither the first connecting portion nor the second connecting portion passes a region between the magnetic core and the first and second pads.

13. The common mode noise filter according to claim 1, wherein
the common mode noise filter further comprises a first stack disposed over the first conductor and a second stack disposed over the second conductor, and
each of the first and second stacks includes two magnetic material layers and a non-magnetic material layer disposed between the two magnetic material layers.

14. A common mode noise filter comprising:
a first insulator layer that includes a main surface and a back surface and has a rectangular shape as viewed in a normal direction perpendicular to the main surface;
a first conductor that is disposed on the back surface of the first insulator layer;
a second conductor that is disposed on the main surface of the first insulator layer; and
a magnetic core that passes through the first insulator layer, wherein:
the first conductor includes:
a first spiral body that is disposed at a position where at least part of the first spiral body overlaps the second conductor as viewed in the normal direction, the first spiral body being wound around the magnetic core;
    a first pad that is disposed inside the first spiral body on the back surface as viewed in the normal direction; and
    a first connecting portion that connects the first spiral body and the first pad on the back surface,
the second conductor includes:
    a second spiral body that is disposed at a position where at least part of the second spiral body overlaps the first conductor as viewed in the normal direction, the second spiral body being wound around the magnetic core;
    a second pad that is disposed inside the second spiral body on the main surface as viewed in the normal direction; and
    a second connecting portion that connects the second spiral body and the second pad on the main surface,
the first pad is disposed at a position where the first pad does not overlap the second conductor as viewed in the normal direction,
the second connecting portion is disposed at an outer side of the first pad opposite to an inner side of the first pad facing the magnetic core, and
a center of the magnetic core, a center point between the first pad and the second pad, and a part of the second connecting portion are located on a same line as viewed in the normal direction.

15. The common mode noise filter according to claim 14, wherein the second pad is disposed at a position where the second pad does not overlap the first conductor as viewed in the normal direction.

16. The common mode noise filter according to claim 14, further comprising:
    a second insulator layer that covers the first spiral body on the back surface of the first insulator layer and disposed between the first stack and the first insulator layer;
    a third insulator layer that covers the second spiral body on the main surface of the first insulator layer and disposed between the second stack and the first insulator layer;
    a first lead-out conductor that is disposed on the back surface of the second insulator layer and includes one end connected to the first pad; and
    a second lead-out conductor that is disposed on the main surface of the third insulator layer and includes one end connected to the second pad, wherein
    the first lead-out conductor does not overlap the second lead-out conductor as viewed in the normal direction.

17. The common mode noise filter according to claim 16, wherein
    the first spiral body has a linear portion and a curved portion, and
    the second spiral body has a linear portion and a curved portion.

18. The common mode noise filter according to claim 17, wherein
    the first lead-out conductor includes a portion that overlaps the linear portion of the first spiral body as viewed in the normal direction, and
    the second lead-out conductor includes a portion that overlaps the linear portion of the second spiral body as viewed in the normal direction.

19. The common mode noise filter according to claim 16, further comprising:
    a third lead-out conductor that is connected to an outer side of the first spiral body;
    a fourth lead-out conductor that is connected to an outer side of the second spiral body;
    a first lead-out portion that connects the outer side of the first spiral body and the third lead-out conductor; and
    a second lead-out portion that connects the outer side of the second spiral body and the fourth lead-out conductor, wherein
    the first lead-out portion does not overlap the second lead-out portion as viewed in the normal direction.

20. The common mode noise filter according to claim 14, wherein:
    the magnetic core is on neither the first pad nor the second pad, and
    length of a first line segment, which is a shortest line segment that crosses the first pad and the second pad and connects two points on an inner peripheral side of the first spiral body of the first conductor as viewed in the normal direction, is shorter than length of a second line segment, which is a shortest line segment that is parallel to the first line segment, crosses the magnetic core, and connects two points on the inner peripheral side of the second spiral body of the first conductor.

* * * * *